US011133670B2

(12) United States Patent
Chen et al.

(10) Patent No.: US 11,133,670 B2
(45) Date of Patent: *Sep. 28, 2021

(54) AIR GAP METAL TIP ELECTROSTATIC DISCHARGE PROTECTION

(71) Applicant: INTERNATIONAL BUSINESS MACHINES CORPORATION, Armonk, NY (US)

(72) Inventors: Qianwen Chen, Yorktown Heights, NY (US); Yang Liu, Ossining, NY (US); Dongbing Shao, Wappingers Falls, NY (US); Zheng Xu, Wappingers Falls, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 76 days.

This patent is subject to a terminal disclaimer.

(21) Appl. No.: 16/663,715

(22) Filed: Oct. 25, 2019

(65) Prior Publication Data

US 2020/0059091 A1     Feb. 20, 2020

Related U.S. Application Data

(63) Continuation of application No. 15/804,605, filed on Nov. 6, 2017, now Pat. No. 10,535,994, which is a
(Continued)

(51) Int. Cl.
*H02H 9/04* (2006.01)
*H01T 4/10* (2006.01)
(Continued)

(52) U.S. Cl.
CPC ............ *H02H 9/044* (2013.01); *H02H 9/046* (2013.01); *H05F 3/00* (2013.01); *H05F 3/04* (2013.01);
(Continued)

(58) Field of Classification Search
CPC .......... H02H 9/044; H02H 9/046; H05F 3/04; H05F 3/00; H05K 1/026; H05K 9/0067; H05K 9/0079; H01T 4/10
(Continued)

(56) References Cited

U.S. PATENT DOCUMENTS 5,933,718 A    8/1999  El-Kareh et al.
5,990,519 A   11/1999  Huang-Lu et al.
(Continued)

OTHER PUBLICATIONS

List of IBM Patents or Patent Applications Treated as Related dated Oct. 25, 2019, 2 pages.
(Continued)

*Primary Examiner* — Dharti H Patel
(74) *Attorney, Agent, or Firm* — Tutunjian & Bitetto, P.C.; Randall Bluestone

(57) ABSTRACT

An air gap metal tip structure is provided for (ESD) protection. The structure includes first and second metal tips disposed along at least one horizontal axis that is parallel to a upper substrate and a lower substrate. The structure includes an air chamber formed between the upper and lower substrate within which the first metal tip and the second metal tip are disposed. The air chamber includes a portion between points of the metal tips. The structure includes an under fill level disposed between the lower and upper substrates, and above one or more layers having the metal tips. Oxygen trapped in the air chamber is converted into ozone responsive to an arc between the metal tips to dissipate the arc, and the ozone is decomposed back into the oxygen responsive to an absence of the arc between the metal tips to maintain the ESD protection for subsequent arcs.

13 Claims, 11 Drawing Sheets

Related U.S. Application Data continuation of application No. 15/414,099, filed on Jan. 24, 2017, now Pat. No. 10,530,150.

(51) Int. Cl.
*H05F 3/04* (2006.01)
*H05F 3/00* (2006.01)
H05K 1/02 (2006.01)
H05K 9/00 (2006.01)

(52) U.S. Cl.
CPC ............... *H01T 4/10* (2013.01); *H05K 1/026* (2013.01); *H05K 9/0067* (2013.01); *H05K 9/0079* (2013.01)

(58) Field of Classification Search
USPC ........................................................ 361/56
See application file for complete search history.

(56) References Cited

U.S. PATENT DOCUMENTS

| | | | |
|---|---|---|---|
| 6,323,599 B1 | 11/2001 | Orchard-Webb | |
| 7,126,804 B1 | 10/2006 | James et al. | |
| 7,535,105 B2 | 5/2009 | Voldman | |
| 7,759,243 B2 | 7/2010 | Ding et al. | |
| 7,768,762 B2 | 8/2010 | Ding et al. | |
| 7,915,158 B2 | 3/2011 | Ding et al. | |
| 8,183,593 B2 | 5/2012 | Drost et al. | |
| 8,279,572 B2 | 10/2012 | Ding et al. | |
| 8,397,639 B2 | 3/2013 | Gordon et al. | |
| 8,482,072 B2 | 7/2013 | Drost et al. | |
| 8,629,560 B2 | 1/2014 | Liu et al. | |
| 8,724,284 B2 | 5/2014 | Umeda et al. | |
| 9,380,688 B1 | 6/2016 | Feng et al. | |
| 10,530,150 B2 * | 1/2020 | Chen | H02H 9/044 |
| 10,535,994 B2 * | 1/2020 | Chen | H05F 3/00 |
| 2009/0091233 A1 | 4/2009 | Te-Pang | |
| 2013/0208395 A1 | 8/2013 | Bultitude et al. | |

OTHER PUBLICATIONS

List of IBM Patents or Patent Applications Treated as Related dated Nov. 6, 2017, 2 pages.

* cited by examiner

AIR GAP METAL TIP ELECTROSTATIC DISCHARGE PROTECTION

BACKGROUND

Technical Field

The present invention relates generally to electrostatic discharge and, in particular, to air gap metal tip electrostatic discharge protection.

Description of the Related Art

Today many integrated circuits are highly susceptible to damage from the discharge of static electricity, which has become a critical problem for the electronics industry. Therefore, various electrostatic discharge (ESD) protection circuits must be included in a device to protect the various components in the device.

ESD is the transfer of an electro-static charge between bodies at different electro-static potentials (voltages), caused by direct contact or induced by an electro-static field. Typical ESD protection circuits use an on-chip diode based ESD protection device. Such an on-chip diode ESD device works well for lower frequency currents but in higher frequency circuits such as millimeter wave circuits, the on-chip diode ESD device severely impairs the performance of the millimeter wave circuits because of its' inability to ameliorate the large parasitic capacitance that arises during the high operating frequency.

A conventional diode ESD device's big intrinsic capacitance causes poor circuit and system performance, especially for high-speed applications. Device failures that result from ESD events are not always immediately catastrophic or apparent. Often, the device is only slightly weakened but is less able to withstand normal operating stresses and, hence, may result in a reliability problem. Thus, there is a need for improved ESD protection.

SUMMARY

According to an aspect of the present invention, an air gap metal tip structure is provided for electrostatic discharge (ESD) protection. The air gap metal tip structure includes a first metal tip and a second metal tip disposed along at least one horizontal axis that is parallel to a upper substrate and a lower substrate disposed below the upper substrate. The air gap metal tip structure further includes an air chamber formed between the upper substrate and the lower substrate within which the first metal tip and the second metal tip are disposed. The air chamber includes a portion between points of the metal tips. The air gap metal tip structure also includes an under fill level disposed between the lower and upper substrates, and above one or more layers having the first metal tip and the second metal tip. Oxygen trapped in the air chamber is converted into ozone responsive to an occurrence of an arc between the metal tips to dissipate the arc, and the ozone is decomposed back into the oxygen responsive to an absence of the arc between the metal tips to maintain the ESD protection for subsequent arcs.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

The present invention is directed to air gap metal tip electrostatic discharge protection.

In an embodiment, the present invention uses air gap metal vertex structures for ESD protection. For example, in an embodiment, the present invention provides an on-chip metal vertex ESD protection device with an air gap. When an arc occurred in the air gap, the oxygen becomes the ozone. Thereafter, the ozone will decompose back to the oxygen automatically, thus resuming the protection function.

The present invention can be used for testing purposes. Moreover, the present invention can be used to eliminate or at least mitigate external issues (external with respect to the device being protected) resulting from multiple "hot unplugs/plugs" and internal (internal with respect to the device being protected) material/device damage by electrostatic discharge.

At high frequency, the present invention has the following characteristics/features:

No big intrinsic parasitic capacitance as suffered by traditional diode devices;

Improved transistor performance without high frequency noises from source voltage (Vdd) or ground (Gnd);

No internal device/dielectric damage from multiple discharges;

Much better reliability and endurance over prior art on-chip diode-based approaches;

Premier re-usability and cycling performance; and

Advanced process compatibility (2.5D or 3D).

In general, an embodiment of the present invention can have the following features:

Normal wafer finished with patterning shifted neighboring wires (same or next layer);

Post-etch down to expose those BEOL metals

Figure 2:
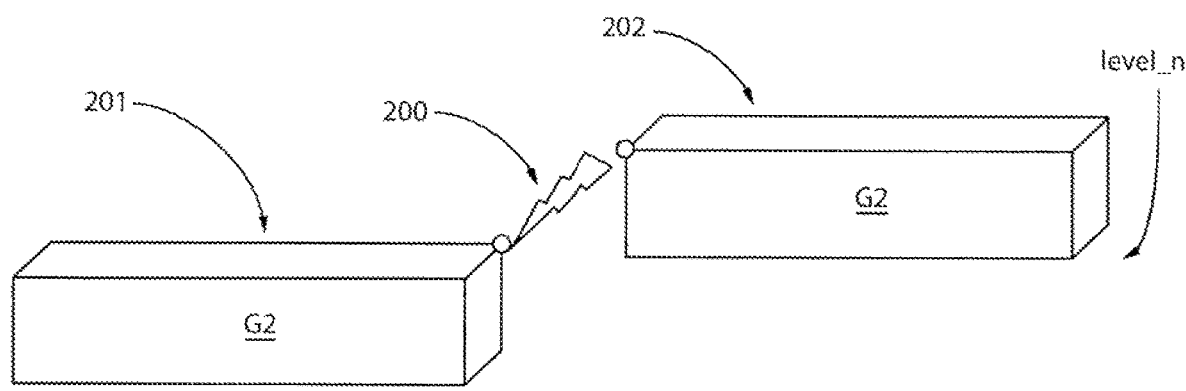
FIG. 2 shows an exemplary metal vertex discharge occurring at the same level_n, in accordance with an embodiment of the present invention.
Figure 3:
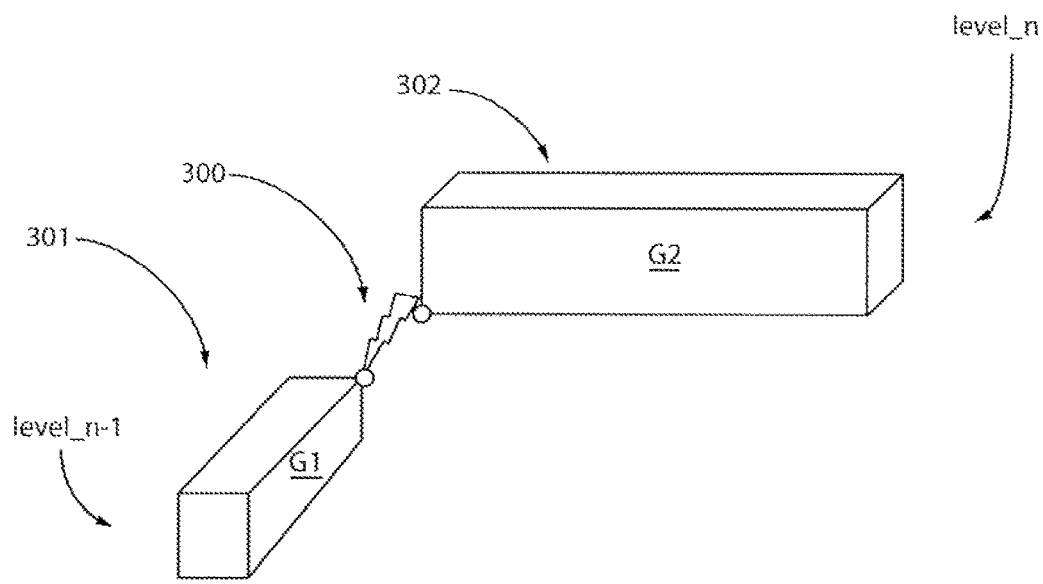
FIG. 3 shows an exemplary metal vertex discharge occurring between level_n and level_n-1, in accordance with an embodiment of the present invention.

Organic substrate placed over, aligned and bonded, under fill formed afterwards;

Use through-holes in the organic substrate for air ventilation;

Air chambers formed C4/Cu pillar on the package side or chip side;

Metal vertices discharge happen at the (i) same level_n (e.g., G2-G2(11x metal)) (see, e.g., FIG. 2) or (ii) level_n and level_n-1 (e.g., G2-G1(11x metal)) (see, e.g., FIG. 3).

Figure 1:
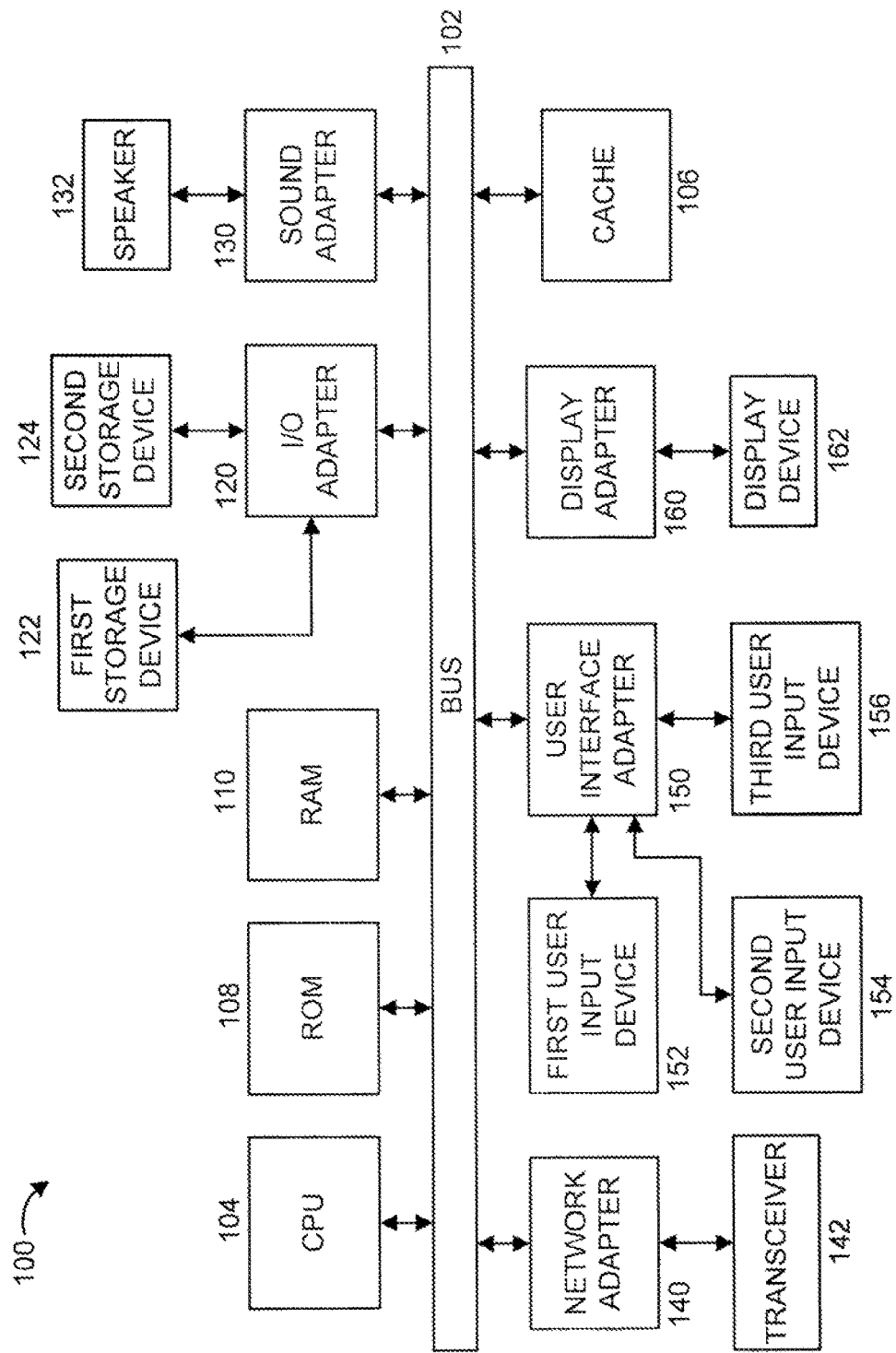
FIG. 1 shows an exemplary processing system to which the present invention may be applied, in accordance with an embodiment of the present invention.

FIG. 1 shows an exemplary processing system 100 to which the invention principles may be applied, in accordance with an embodiment of the present invention. It is to be appreciated that system 100 includes a plurality of electronic computing device sub-components. It is to be further appreciated that one or more integrated circuits in need of ESD protection can be included in one or more of the plurality of sub-components.

The processing system 100 includes at least one processor (CPU) 104 operatively coupled to other components via a system bus 102. A cache 106, a Read Only Memory (ROM) 108, a Random Access Memory (RAM) 110, an input/output (I/O) adapter 120, a sound adapter 130, a network adapter 140, a user interface adapter 150, and a display adapter 160, are operatively coupled to the system bus 102.

A first storage device 122 and a second storage device 124 are operatively coupled to system bus 102 by the I/O adapter 120. The storage devices 122 and 124 can be any of a disk storage device (e.g., a magnetic or optical disk storage device), a solid state magnetic device, and so forth. The storage devices 122 and 124 can be the same type of storage device or different types of storage devices.

A speaker 132 is operatively coupled to system bus 102 by the sound adapter 130. A transceiver 142 is operatively coupled to system bus 102 by network adapter 140. A display device 162 is operatively coupled to system bus 102 by display adapter 160.

A first user input device 152, a second user input device 154, and a third user input device 156 are operatively coupled to system bus 102 by user interface adapter 150. The user input devices 152, 154, and 156 can be any of a keyboard, a mouse, a keypad, an image capture device, a motion sensing device, a microphone, a device incorporating the functionality of at least two of the preceding devices, and so forth. Of course, other types of input devices can also be used, while maintaining the spirit of the present invention. The user input devices 152, 154, and 156 can be the same type of user input device or different types of user input devices. The user input devices 152, 154, and 156 are used to input and output information to and from system 100.

Of course, the processing system 100 may also include other elements (not shown), as readily contemplated by one of skill in the art, as well as omit certain elements. For example, various other input devices and/or output devices can be included in processing system 100, depending upon the particular implementation of the same, as readily understood by one of ordinary skill in the art. For example, various types of wireless and/or wired input and/or output devices can be used. Moreover, additional processors, controllers, memories, and so forth, in various configurations can also be utilized as readily appreciated by one of ordinary skill in the art. These and other variations of the processing system 100 are readily contemplated by one of ordinary skill in the art given the teachings of the present invention provided herein.

With respect to the FIGURES hereinafter, the terms "metal tip" and "vertex" are used interchangeably. Moreover, "G2" denotes a metal tip on a level_n, while "G1" denotes a metal tip on a level_n-1.

FIG. 2 shows an exemplary metal vertex discharge 200 occurring at the same level_n (e.g., G2-G2(11x)), in accordance with an embodiment of the present invention. The exemplary metal vertex discharge 200 is between a first metal tip 201 and a second metal tip 202 at the same level (i.e., level_n). In FIG. 2, "G2" denotes a metal tip on a level_n (such that, in the case of FIG. 2, both first and second metal tips 201 and 202 are G2 metal tips on level_n).

FIG. 3 shows an exemplary metal vertex discharge 300 occurring between level_n and level_n-1 (e.g., G2-G1 (11x)), in accordance with an embodiment of the present invention. The exemplary metal vertex discharge 300 is between a first metal tip 301 and a second metal tip 302 at different levels (i.e., level_n-1 and level_n). In FIG. 3, "G1" denotes a metal tip on a level_n-1 (such that in the case of FIG. 3, first metal tip 301 is a G1 metal tip on level_n-1), and "G2" denotes a metal tip on level_n (such that in the case of FIG. 3, second metal tip 302 is a G2 metal tip on level_n).

In the case of the metal vertices shown in FIGS. 2 and 3, $E_{BD}=30$ KV/cm (or equivalently 3V/um), and electricity/arcing can occur from $3 O_2$ to $2 O_3$.

Figure 4:
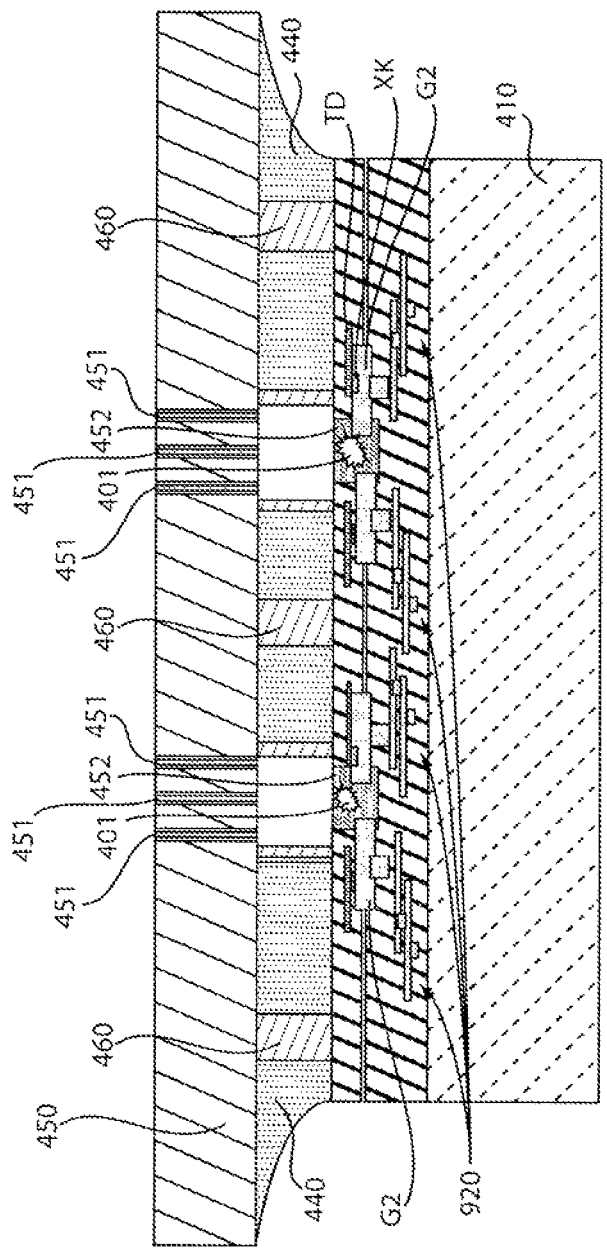
FIG. 4 shows an exemplary semiconductor structure having air gap metal tip ESD protection, in accordance with an embodiment of the present invention.

FIG. 4 shows an exemplary semiconductor structure 400 having air gap metal tip ESD protection, in accordance with an embodiment of the present invention. The exemplary semiconductor structure 400 of FIG. 4 depicts a G2 electrostatic discharge 401 by shifted G2 vertices. It is to be appreciated that the elements of semiconductor structure 400 are not to scale, having certain elements with an emphasized size for the sake of illustration.

Figure 5:
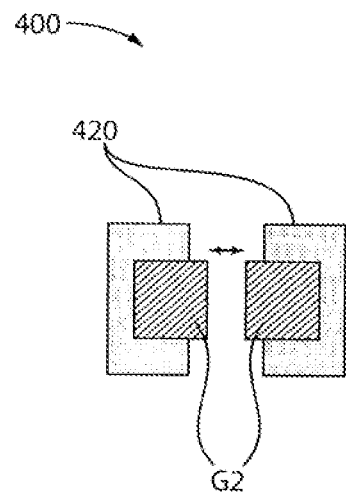
FIG. 5 shows a cross-sectional view of an air gap electrostatic discharge in the semiconductor structure of FIG. 4, in accordance with an embodiment of the present invention.

FIG. 5 shows a cross-sectional view of an air gap electrostatic discharge in the semiconductor structure 400 of FIG. 4, in accordance with an embodiment of the present invention.

Figure 6:
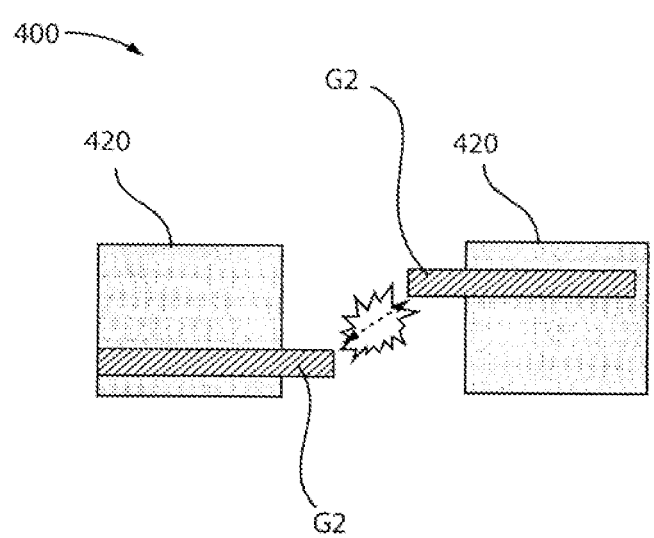
FIG. 6 shows a top view of an air gap electrostatic discharge in the semiconductor structure of FIG. 4, in accordance with an embodiment of the present invention.

FIG. 6 shows a top view of an air gap electrostatic discharge in the semiconductor structure 400 of FIG. 4, in accordance with an embodiment of the present invention.

Regarding at least FIGS. 1 and 4-8, the shift between the G2 vertices relates to a spatial difference between the longitudinal axes of the G2 vertices such that the longitudinal axes of the G2 vertices are not aligned, noting that both G2 vertices are on a same level_n, as readily seen in FIG. 6.

Regarding at least FIGS. 4-6, the following applies:

$S_{GX}$~0.36 um (tip distance), $h_{GX}$=0.88 um tip roundness~0.12 um 14 LPP, 3Mx_2Cx_2Kx_2Gx_TD $V_{discharging}=1.08V$ Referring back to FIG. 4, the semiconductor structure 400 includes a lower substrate 410, a FEOL/BEOL layer 420, an under fill layer 440, an upper organic substrate 450, and bonded Cu pillars or C4 460. "XK" denotes a via sitting between G2 and TD metals, and "TD" denotes a top metal in silicon wafer as illustrated.

Through vias 451 allow external air to pass through the upper organic substrate 450 to air cavities 401 in the under fill layer 440 and to air chambers 452 in the FEOL/BEOL layer 420 (e.g., the lower portion of layer 420 can include the FEOL portion, while the upper portion of layer 420 can include the BEOL portion). The air chambers 452 are used for electrostatic discharge. The FEOL/BEOL layer 420 includes other metal structures 420A corresponding to one or more circuits and/or circuit elements.

Figure 7:
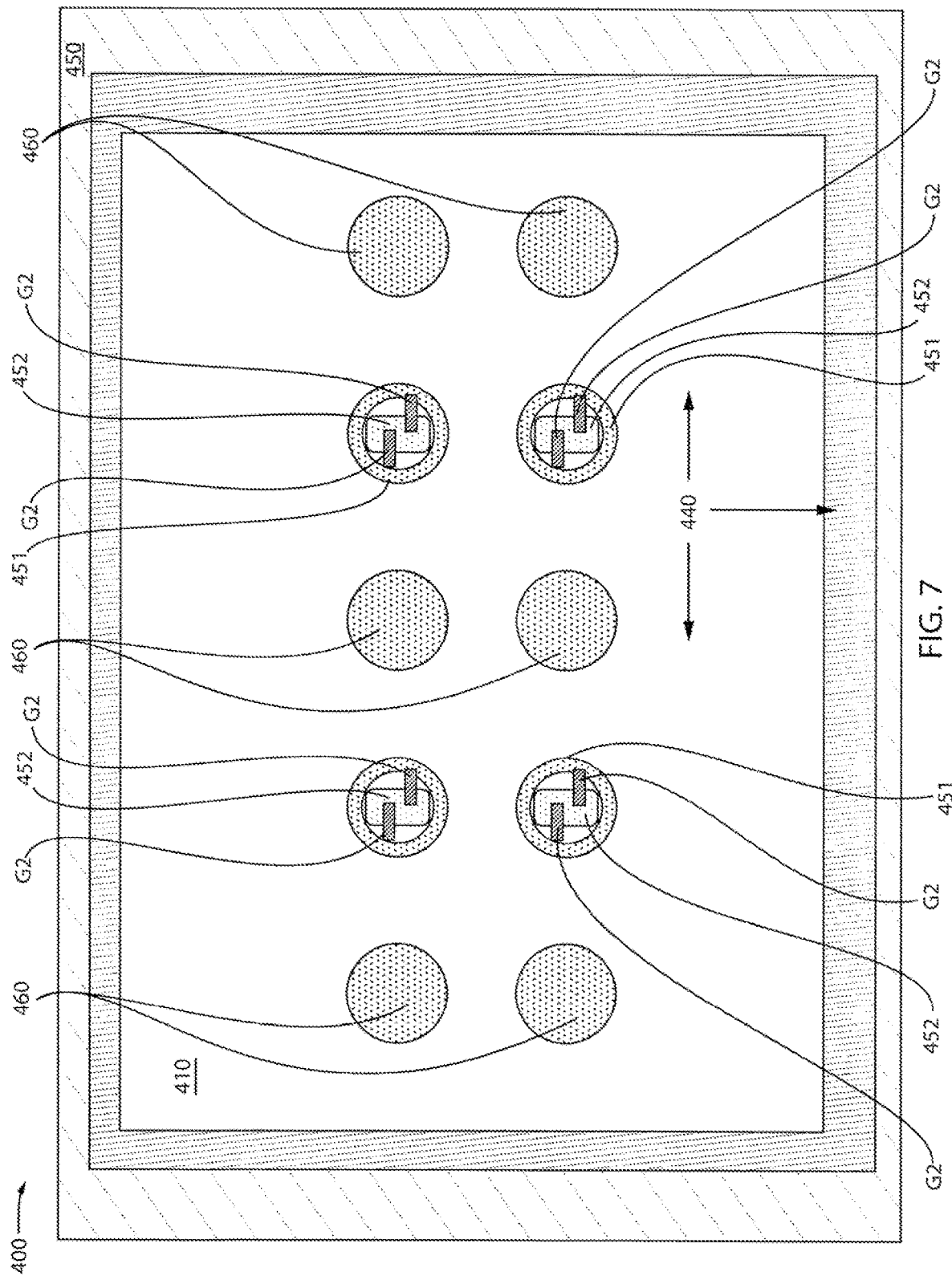
FIG. 7 shows a top-down view of the semiconductor structure 400 of FIG. 4 after a flip, in accordance with an embodiment of the present invention.

FIG. 7 shows a top-down view of the semiconductor structure 400 of FIG. 4 after a flip, in accordance with an embodiment of the present invention.

As seen in FIG. 7, the air chambers 351 and the G2 tips therein are visible through through-vias 451 dispersed throughout the semiconductor structure 400. C4/Pillars 460 are also dispersed throughout the semiconductor structure 400.

Each of the through vias 451 are encompassed by a solder/copper ring 711.

Figure 8:
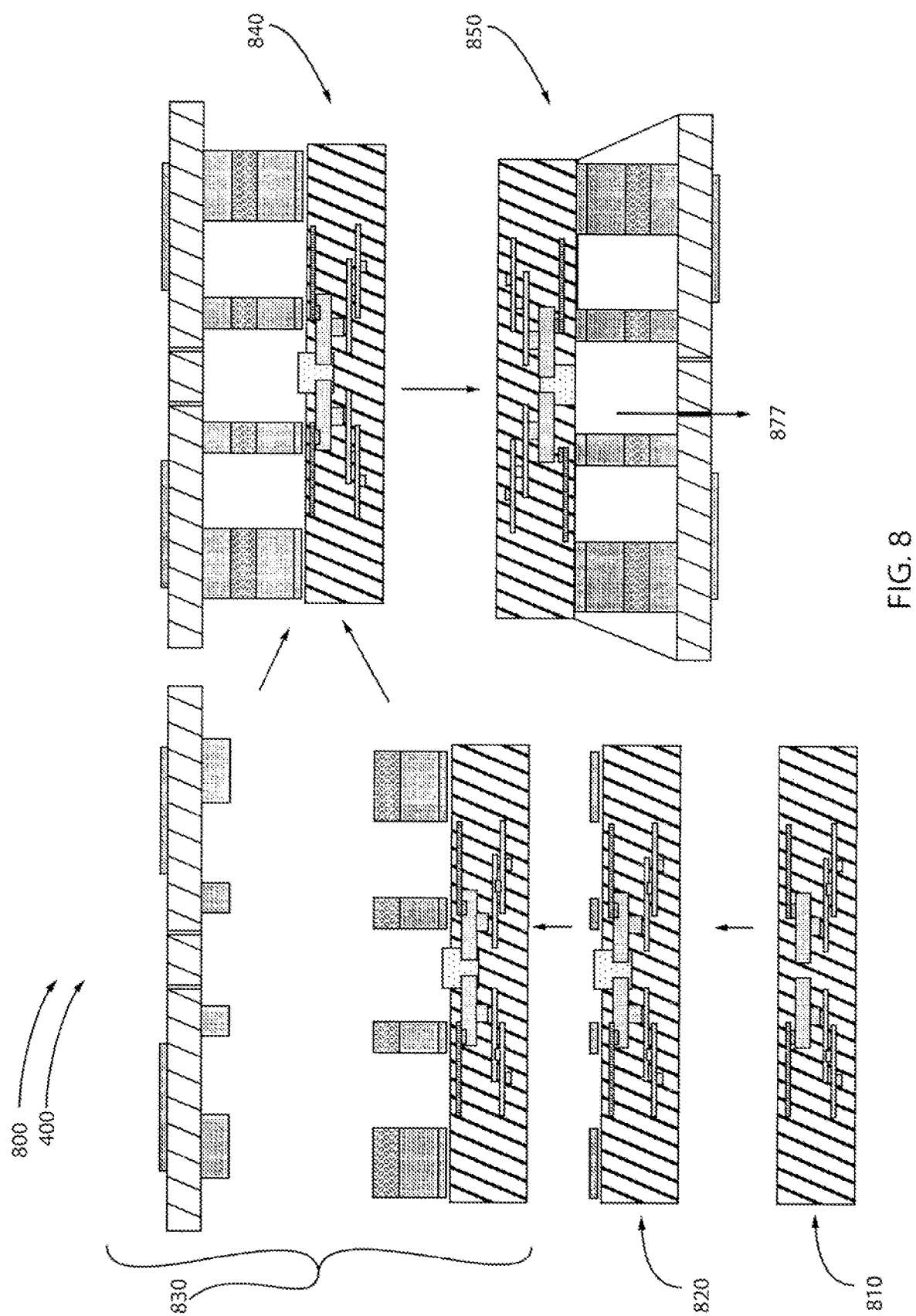
FIG. 8 shows a manufacturing flow for forming the semiconductor structure of FIG. 4, in accordance with an embodiment of the present invention.

FIG. 8 shows a manufacturing flow 800 for forming the semiconductor structure 400 of FIG. 4, in accordance with an embodiment of the present invention.

At step 810, perform normal wafer finished with patterning shifted or non-shifted neighboring wires (same or next layer).

At step 820, post-etch down to expose BEOL metals for an electro-static discharge purpose. Step 820 includes forming air chambers in which the electro-static discharge will occur.

At step 830, place and align the organic upper substrate with the underlying structure that includes the lower substrate and the FEOL/BEOL layer.

At step 840, bond the organic upper substrate to the underlying structure that includes the lower substrate and the FEOL/BEOL layer. Use through-holes in the organic substrate for air ventilation. Form air chambers C4/Cu pillar on the package side or chip side.

At step 850, form the under fill layer 440. Note the pathway 877 for air chamber discharge.

Figure 9:
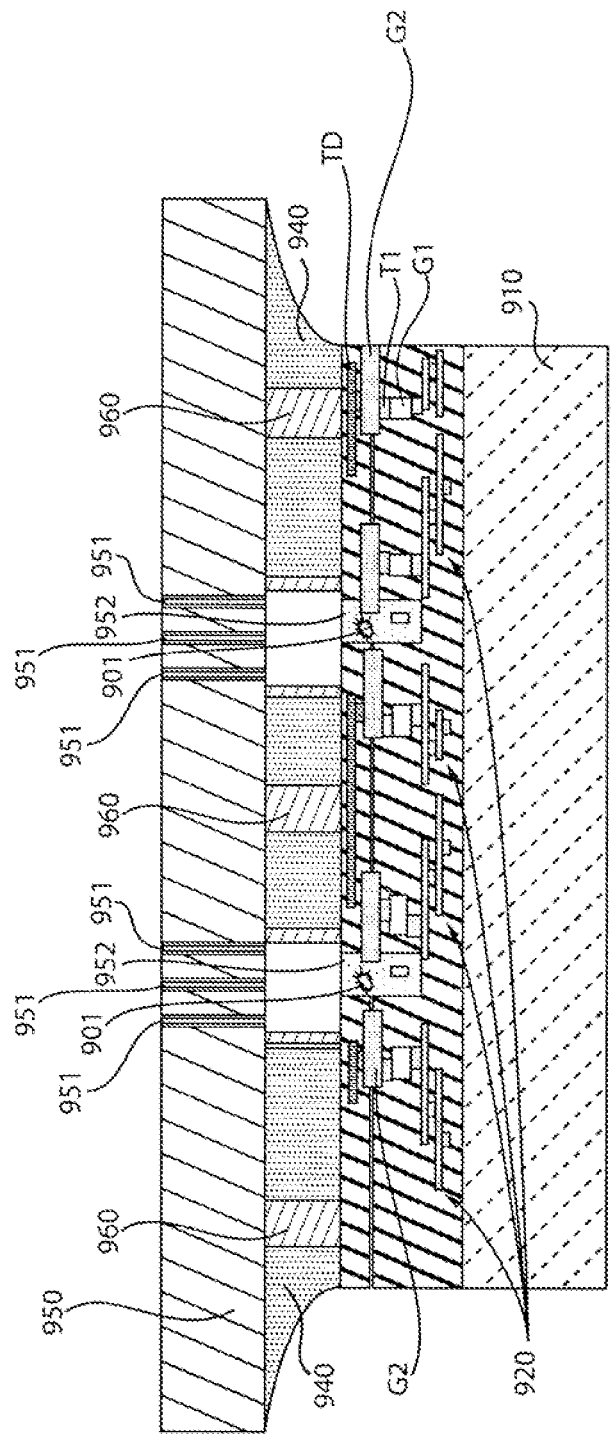
FIG. 9 shows another exemplary semiconductor structure having air gap metal tip ESD protection, in accordance with an embodiment of the present invention.

FIG. 9 shows another exemplary semiconductor structure 900 having air gap metal tip ESD protection, in accordance with an embodiment of the present invention. The exemplary semiconductor structure 900 of FIG. 9 depicts a G2-G1 electrostatic discharge 901 by shifted vertices. It is to be appreciated that the elements of semiconductor structure 400 are not to scale, having certain elements with an emphasized size for the sake of illustration.

Figure 10:
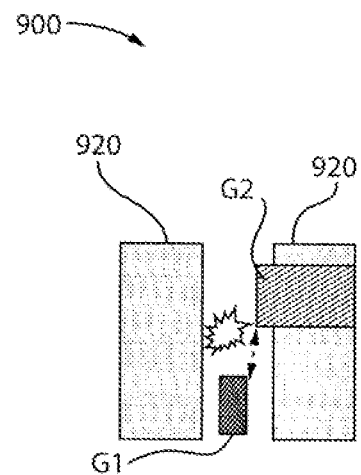
FIG. 10 shows a cross-sectional view of an air gap electrostatic discharge in the semiconductor structure of FIG. 9, in accordance with an embodiment of the present invention.

FIG. 10 shows a cross-sectional view of an air gap electrostatic discharge in the semiconductor structure 900 of FIG. 9, in accordance with an embodiment of the present invention.

Figure 11:
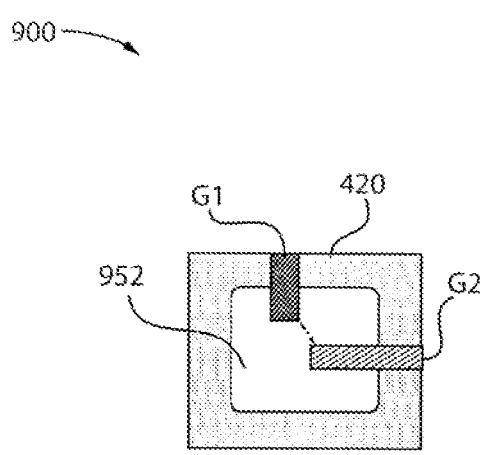
FIG. 11 shows a top view of an air gap electrostatic discharge in the semiconductor structure of FIG. 9, in accordance with an embodiment of the present invention.

FIG. 11 shows a top view of an air gap electrostatic discharge in the semiconductor structure 900 of FIG. 9, in accordance with an embodiment of the present invention.

Regarding FIGS. 2 and 9-13, the shift between the G1 and G2 vertices relates to a spatial difference between the longitudinal axes of the G2 vertices such that the longitudinal axis of the G1 vertex is at a 90 degrees orientation with respect to the longitudinal axis of the G2 vertex (as readily seen in FIGS. 10 and 11), noting that the G1 vertex is a level_n-1 and the G2 vertex is at a level_n. That is, the shift is substantially 90 degrees, with the term "substantially" factoring in manufacturing tolerances, and so forth, as readily appreciated by one of ordinary skill in the art. While substantially 90 degrees is shown as the shift angle between the longitudinal axes of the first and second metal tips, other shift angles can also be used, as readily appreciate by one of ordinary skill in the art, while maintaining the spirit of the present invention.

Regarding at least FIGS. 9-11, the following applies:
$S_{GX}$~0.36u, $h_{T1}$=0.6 um (tip distance tip roundness~0.12 um
$V_{discharging}$=1.8V Referring back to FIG. 9, the semiconductor structure 900 includes a lower substrate 910, a FEOL/BEOL layer 920, an under fill layer 940, an upper organic substrate 950, and bonded Cu pillars or C4 960. "XK" denotes a via sitting between G2 and TD metals, "T1" denotes a via sitting between G2 and G1 metals, and "TD" denotes a top metal in silicon wafer as illustrated.

Through vias 951 allow external air to pass through the upper organic substrate 950 to air cavities 901 in the under fill layer 940 and to air chambers 952 in the FEOL/BEOL layer 920 (e.g., the lower portion of layer 920 can include the FEOL portion, while the upper portion of layer 920 can include the BEOL portion). The air chambers 952 are used for electrostatic discharge. The FEOL/BEOL layer 920 includes other metal structures 920A corresponding to one or more circuits and/or circuit elements.

Figure 12:
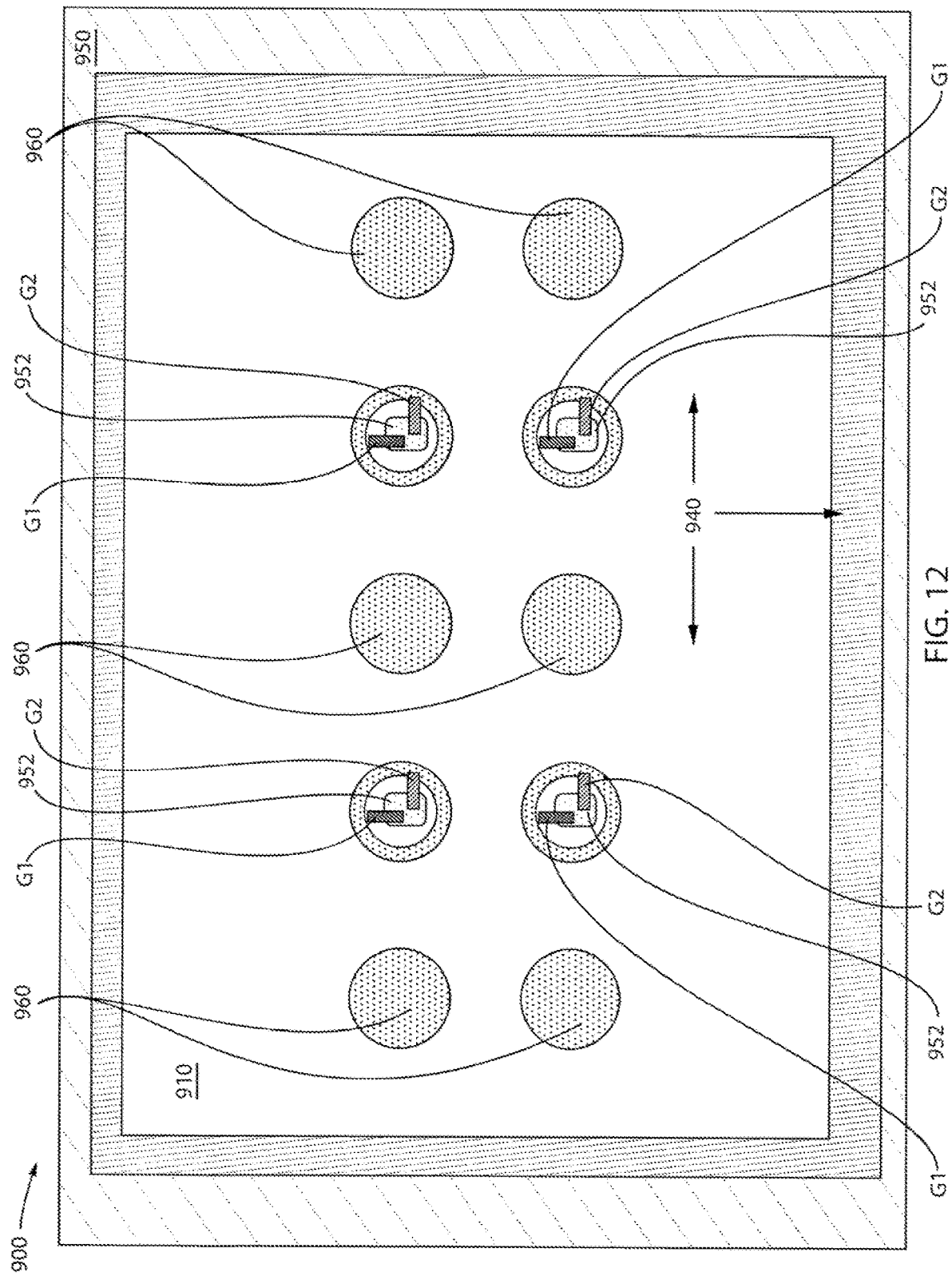
FIG. 12 shows a top-down view of the semiconductor structure of FIG. 9 after a flip, in accordance with an embodiment of the present invention.

FIG. 12 shows a top-down view of the semiconductor structure 900 of FIG. 9 after a flip, in accordance with an embodiment of the present invention.

As seen in FIG. 12, the air chambers 951 and the G1 and G2 tips therein are visible through through-vias 951 dispersed throughout the semiconductor structure 900. C4/Pillars 960 are also dispersed throughout the semiconductor structure 900.

Each of the through vias 951 are encompassed by a solder/copper ring 1211.

Figure 13:
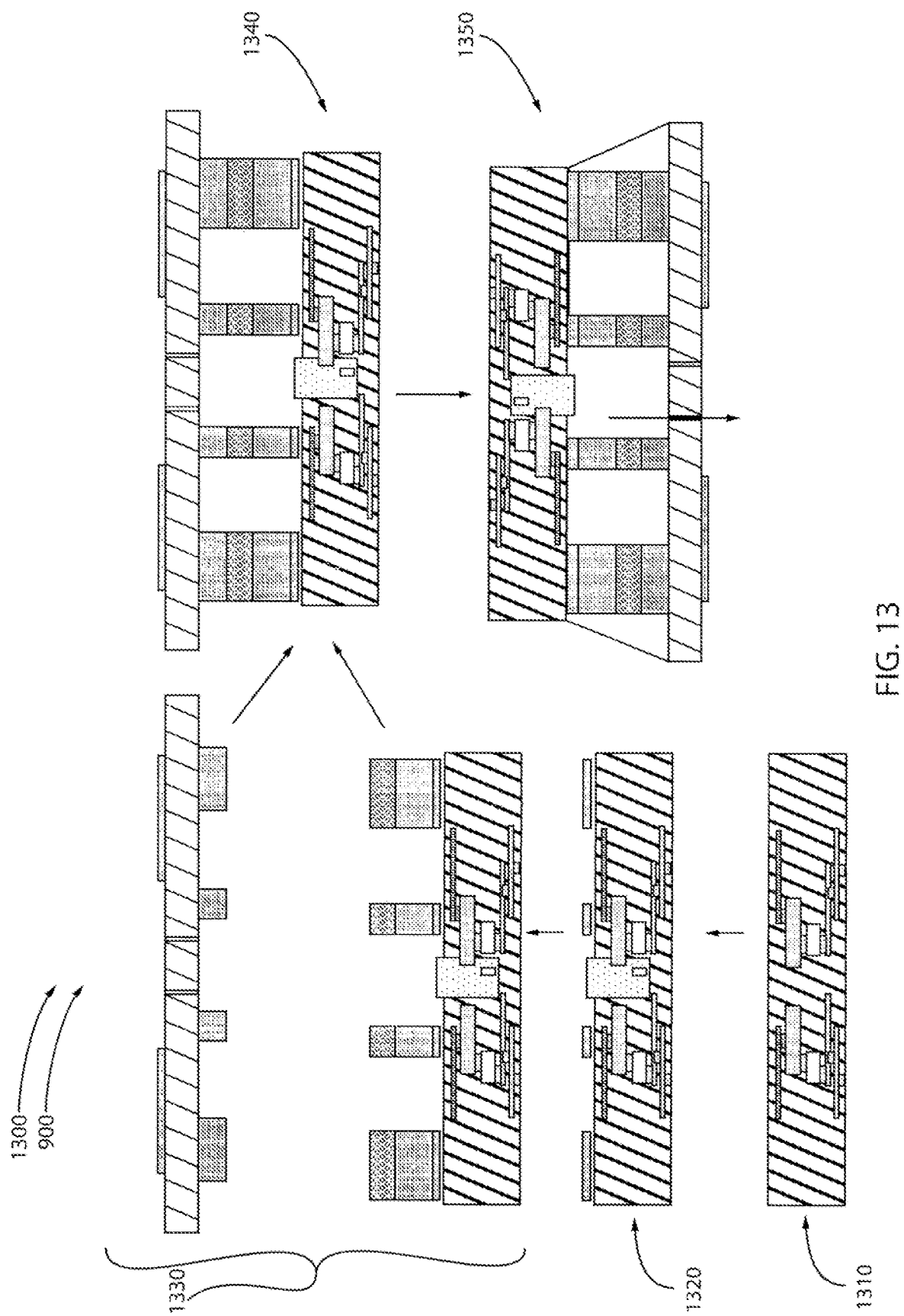
FIG. 13 shows a manufacturing flow for forming the semiconductor structure of FIG. 9, in accordance with an embodiment of the present invention.

FIG. 13 shows a manufacturing flow 1300 for forming the semiconductor structure 900 of FIG. 9, in accordance with an embodiment of the present invention.

At step 1310, perform normal wafer finished with patterning shifted or non-shifted neighboring wires (same or next layer).

At step 1320, post-etch down to expose BEOL metals for an electro-static discharge purpose. Step 1320 includes forming air chambers in which the electro-static discharge will occur.

At step 1330, place and align the organic upper substrate with the underlying structure that includes the lower substrate and the FEOL/BEOL layer.

At step 1340, bond the organic upper substrate to the underlying structure that includes the lower substrate and the FEOL/BEOL layer. Use through-holes in the organic substrate for air ventilation. Form air chambers C4/Cu pillar on the package side or chip side.

At step 1350, form the under fill layer 940. Note the pathway 1377 for air chamber discharge.

Figure 14:
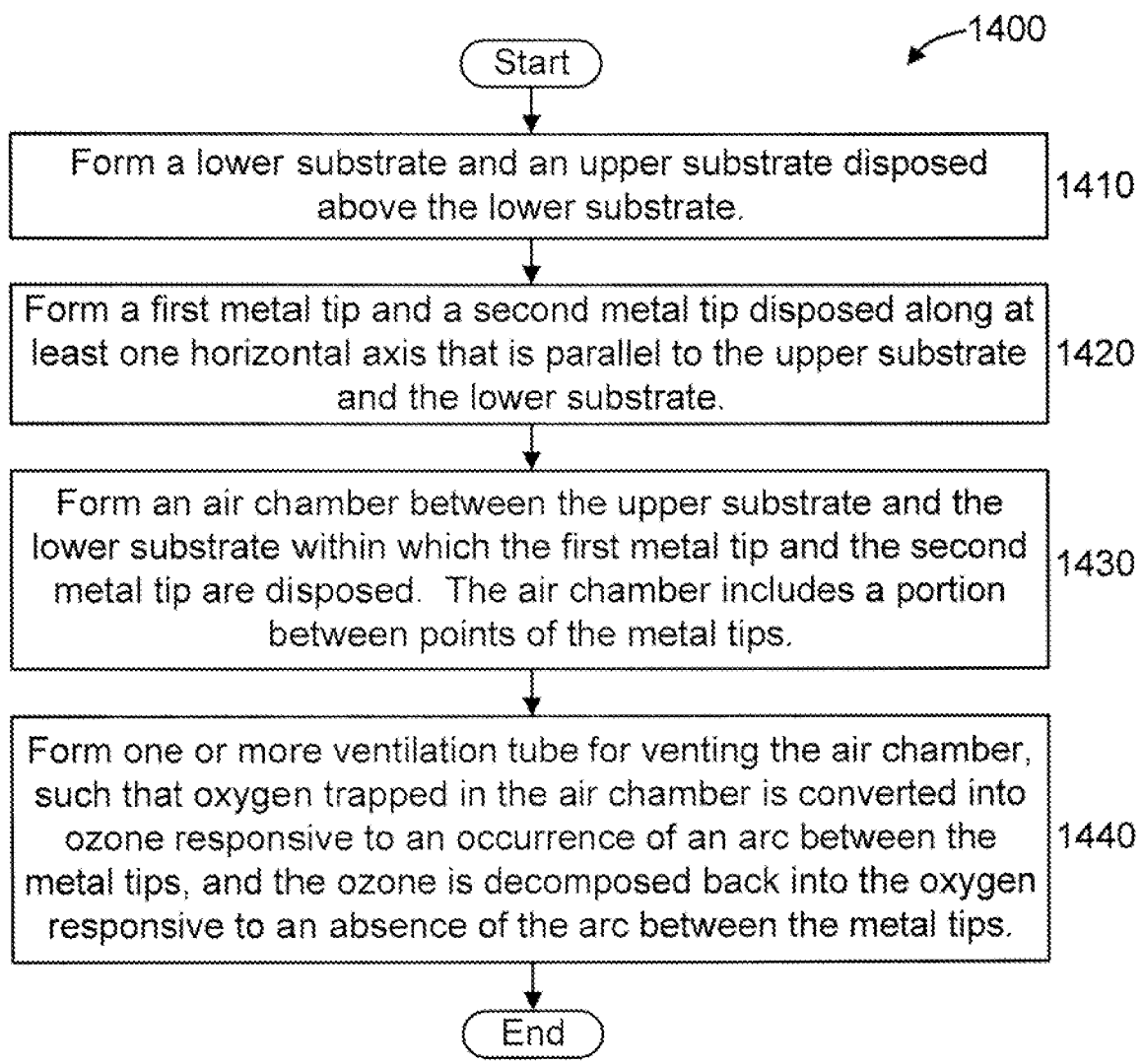
FIG. 14 shows an exemplary method for forming an air gap metal tip electrostatic discharge protection device, in accordance with an embodiment of the present invention.

FIG. 14 shows an exemplary method 1400 for forming an air gap metal tip electrostatic discharge protection device, in accordance with an embodiment of the present invention.

At step 1410, form a lower substrate and an upper substrate disposed above the lower substrate.

At step 1420, form a first metal tip and a second metal tip disposed along at least one horizontal axis that is parallel to the upper substrate and the lower substrate.

At step 1430, form an air chamber between the upper substrate and the lower substrate within which the first metal tip and the second metal tip are disposed. The air chamber includes a portion between points of the metal tips.

At step 1440, form one or more ventilation tube for venting the air chamber, such that oxygen trapped in the air chamber is converted into ozone responsive to an occurrence of an arc between the metal tips, and the ozone is decomposed back into the oxygen responsive to an absence of the arc between the metal tips.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xG_{1-x}$ where x is less than or equal to 1, etc. In addition, other elements may be included in the compound and still function in accordance with the present principles. The compounds with additional elements will be referred to herein as alloys.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, may be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly. In addition, it will also be understood that when a layer is referred to as being "between" two layers, it can be the only layer between the two layers, or one or more intervening layers may also be present.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present concept.

Having described preferred embodiments of the present invention (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. An air gap metal tip structure for electrostatic discharge (ESD) protection, comprising:
    a first metal tip and a second metal tip disposed at adjacent different levels relative to at least one horizontal axis that is parallel to a upper substrate and a lower substrate disposed below the upper substrate;
    an air chamber formed between the upper substrate and the lower substrate within which the first metal tip and the second metal tip are disposed, the air chamber including a portion between points of the metal tips; and
    an under fill level disposed between the lower and upper substrates, and above one or more layers having the first metal tip and the second metal tip;
    wherein oxygen trapped in the air chamber is converted into ozone responsive to an occurrence of an arc between the metal tips to dissipate the arc, and the ozone is decomposed back into the oxygen responsive to an absence of the arc between the metal tips to maintain the ESD protection for subsequent arcs.

2. The air gap metal tip structure of claim 1, further comprising one or more ventilation tubes connected between the air chamber and an external opening of the structure for venting the air chamber such that the oxygen is replenished in or discharged from the air chamber by the one or more ventilation tubes, respectively responsive to the occurrence or absence of the arc.

3. The air gap metal tip structure of claim 2, wherein the one or more ventilation tubes comprise through vias.

4. The air gap metal tip structure of claim 1, wherein the first metal tip comprises back end of line metals.

5. The air gap metal structure of claim 4, wherein the second metal comprises the back end of line metals.

6. The air gap metal tip structure of claim 1, wherein the first metal tip comprises far back end of line metals.

7. The air gap metal tip structure of claim 6, wherein the second metal tip comprises far back end of line metals.

8. The air gap metal tip structure of claim 1, wherein the at least one horizontal axis comprises (i) a first horizontal axis on a first layer and (ii) a second horizontal axis on a second layer different from and adjacent to the first layer.

9. The air gap metal tip structure of claim 8, wherein the first metal tip is disposed along the first horizontal axis.

10. The air gap metal tip structure of claim 8, wherein the second metal tip is disposed along the second horizontal axis.

11. The air gap metal tip structure of claim 1, wherein the upper substrate comprises an organic compound.

12. The air gap metal tip structure of claim 1, wherein the respective longitudinal axis of the first metal tip and the second metal shift are shifted relative to one another.

13. The air gap metal tip structure of claim 1, wherein the respective longitudinal axis of the first metal tip and the second metal shift are shifted by substantially 90 degrees relative to one another.

* * * * *